United States Patent
Dreher et al.

(10) Patent No.: US 12,379,417 B2
(45) Date of Patent: Aug. 5, 2025

(54) METHOD AND ARRANGEMENT FOR DETERMINING THE FUNCTIONALITY OF AN ALTERNATOR

(71) Applicants: Scania CV AB, Södertälje (SE); Prestolite Electric Ltd., Greenford (GB)

(72) Inventors: Holger Dreher, Södertälje (SE); Markus Örn, Eskilstuna (SE); Jeremy Stevens, London (GB)

(73) Assignees: Scania CV AB, Södertälje (SE); Prestolite Electric Ltd., Greenford (GB)

( * ) Notice: Subject to any disclaimer, the term of this patent is extended or adjusted under 35 U.S.C. 154(b) by 272 days.

(21) Appl. No.: 17/785,191

(22) PCT Filed: Dec. 3, 2020

(86) PCT No.: PCT/SE2020/051162
§ 371 (c)(1),
(2) Date: Jun. 14, 2022

(87) PCT Pub. No.: WO2021/126043
PCT Pub. Date: Jun. 24, 2021

(65) Prior Publication Data
US 2023/0035162 A1 Feb. 2, 2023

(30) Foreign Application Priority Data

Dec. 17, 2019 (SE) .................................. 1951481-9

(51) Int. Cl.
*G01R 31/34* (2020.01)

(52) U.S. Cl.
CPC .................................. *G01R 31/343* (2013.01)

(58) Field of Classification Search
CPC ............... G01R 31/343; H02P 2101/45; H02P 2207/05
See application file for complete search history.

(56) References Cited

U.S. PATENT DOCUMENTS

| 5,182,511 A | * | 1/1993 | Pierret | ..................... H02J 7/16 340/661 |
| 5,982,155 A | * | 11/1999 | Rechdan | ................... H02P 9/30 318/400.31 |

(Continued)

FOREIGN PATENT DOCUMENTS

EP 1744169 A2 1/2007

OTHER PUBLICATIONS

Extended European Search Report issued for corresponding European National Stage Application No. 20901040.4, issued on Dec. 14, 2023.

(Continued)

*Primary Examiner* — Catherine T. Rastovski
*Assistant Examiner* — Lal Ce Mang
(74) *Attorney, Agent, or Firm* — Renner, Otto, Boisselle & Sklar, LLP.

(57) ABSTRACT

An arrangement for generating electric energy comprises an alternator having a rotor with a winding for being magnetized by an electric current fed therethrough and a stator with at least three stator windings for generation of three phase voltages therein upon rotation of the magnetized rotor in the stator. A rectifier has an input connected to the stator windings. Means is configured to measure the development over time of the difference of two of said phase voltages and an evaluation unit is configured to evaluate the result of this measurement to determine the functionality of the alternator. A control unit located remote to the alternator controls the rotor current.

11 Claims, 3 Drawing Sheets

(56) References Cited

U.S. PATENT DOCUMENTS

| | | | |
|---|---|---|---|
| 9,500,709 B2 | 11/2016 | Vanoli | |
| 2007/0210763 A1* | 9/2007 | Aoyama | H02P 9/48 |
| | | | 322/28 |
| 2009/0085531 A1* | 4/2009 | Ooiwa | H02P 9/48 |
| | | | 322/24 |
| 2013/0187447 A1 | 7/2013 | Pyko | |
| 2013/0314013 A1 | 11/2013 | Ajima | |
| 2015/0123671 A1 | 5/2015 | Yannam | |
| 2016/0252578 A1 | 9/2016 | Vanoli | |
| 2016/0365813 A1* | 12/2016 | Graefling | H02P 9/48 |
| 2018/0351438 A1* | 12/2018 | Cairoli | H02K 5/225 |
| 2019/0011488 A1 | 1/2019 | Mueller | |
| 2019/0265284 A1* | 8/2019 | Frampton | G01R 1/28 |

OTHER PUBLICATIONS

International Search Report and Written Opinion for International Application No. PCT/SE2020/051162 mailed on Feb. 16, 2021.

* cited by examiner

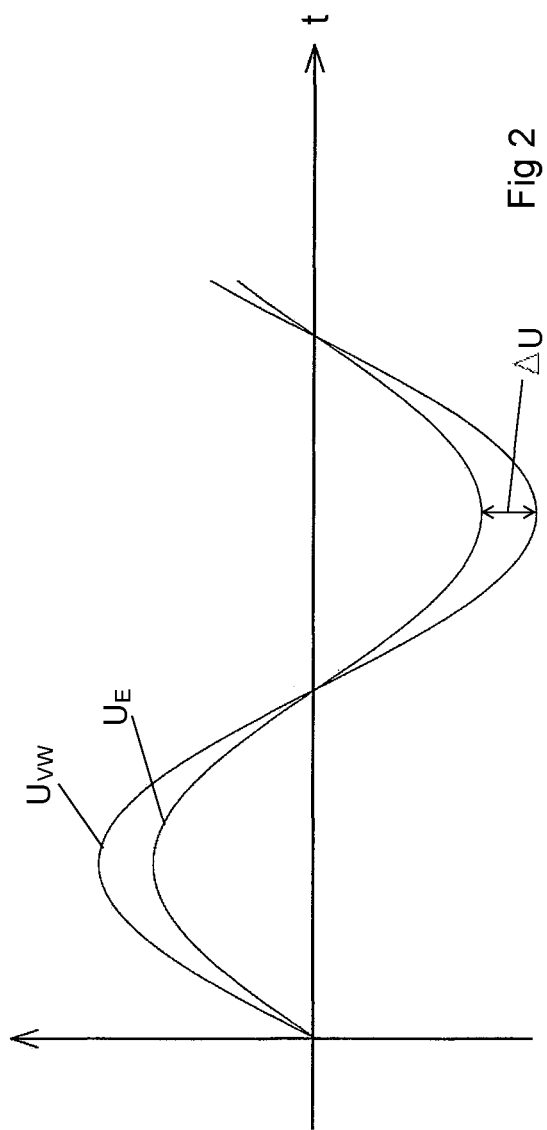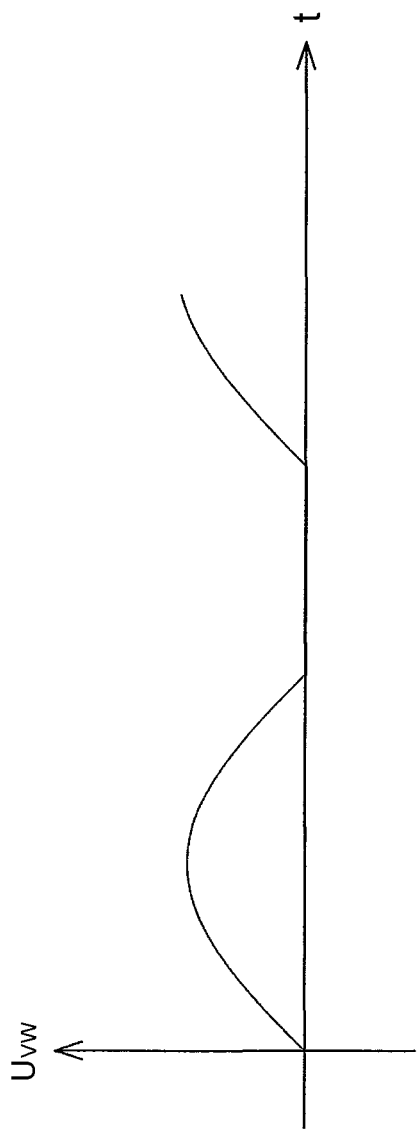

METHOD AND ARRANGEMENT FOR DETERMINING THE FUNCTIONALITY OF AN ALTERNATOR

This application is a national phase of International Application No. PCT/SE2020/051162 filed Dec. 3, 2020, which claims priority to Swedish Application No. 1951481-9 filed Dec. 17, 2019, each of which is hereby incorporated herein by reference in its entirety.

TECHNICAL FIELD OF THE INVENTION

The present invention relates to an arrangement for generating electric energy comprising an alternator having
  a rotor which is configured to be connected to a source of mechanic energy for being rotated and which is provided with a winding for being magnetised by an electric current fed therethrough,
  a stator surrounding the rotor and having at least three stator windings for generation of at least three phase voltages in these windings upon rotation of the magnetised rotor therein, and
  a rectifier with an input connected to the stator windings and configured to convert said phase voltages into a direct voltage on an output of the alternator,
  the arrangement further comprising a control unit located remote to the alternator and configured to control the alternator by controlling the rotor current flowing through the rotor winding, as well as a method according to the preamble of the appended independent method claim.

Such an arrangement may as examples have the rotor of the alternator connected to a source of mechanic energy of a motor vehicle or within an industrial application. The first of these two examples will hereinafter mainly be discussed so as to illuminate the invention and the problems to be solved thereby without by that in any way restricting the invention thereto.

The advantages of having said control unit, i.e. the hardware related to the alternator control including the control of the rotor currents, moved out of the alternator instead of having that control unit included in the alternator are several. The allowable temperature range for the alternator is increased, since there is no electronics inside the alternator limiting the allowable temperature range. Another advantage is that the alternator design is simplified and an inherent galvanic isolation between the alternator control and the alternator output increasing the robustness of the system is obtained.

However, it is desired to be able to determine the functionality of the alternator so as to detect faults within the arrangement or in connections thereto and by that protect components of the arrangement and/or detect that any component has to be replaced.

BACKGROUND ART

US 2013/0187447 describes an arrangement of the type defined in the introduction enabling a type of diagnosis of the alternator included therein, but this diagnosis requires the presence of a plurality of alternators and that one of the alternators is turned off. Thus, no diagnosis of an arrangement for determining the functionality of an alternator thereof may by use of the method disclosed there be carried out for the case of a single alternator present in the arrangement.

SUMMARY OF THE INVENTION

The object of the present invention is to provide an arrangement and a method of the type defined in the introduction being improved with respect to such arrangements already known by solving the problem mentioned above.

This object is according to the invention with respect to the arrangement obtained by providing such an arrangement with the features listed in the characterizing part of appended patent claim 1.

Thus, the arrangement comprises means configured to measure the development over time of the difference of two of said phase voltages connected to the input of the rectifier, and an evaluation unit configured to evaluate the result of this measurement to determine the functionality of the alternator. This means that a diagnosis with the aim to determine the functionality of the alternator may be efficiently carried out without any need of having more than one alternator for that sake, although it is within the scope of the invention that the arrangement according to the invention comprises more than one alternator. It has been found that by measuring the development over time of the difference of two of said phase voltages a robust system delivering reliable measurement results for the determination of the functionality of the alternator with a low degree of influence from different disturbances is obtained. Furthermore, the result of such measurements will constitute a reliable indication of the functionality of the alternator.

According to an embodiment of the invention the evaluation unit is configured to send the result of said evaluation to said control unit which is configured to make the control of the rotor current and by that of the alternator depending upon the result of said evaluation. This means that the alternator may be controlled in dependence of the result of said evaluation by controlling the rotor current.

According to another embodiment of the invention the evaluation unit and the control unit are included in the same electronic control unit configured to control the alternator.

According to another embodiment of the invention the evaluation unit is configured to compare the development over time of the difference of the two phase voltages measured with a development over time of a reference value of this voltage difference, and the control unit is configured to control the rotor current flowing through the rotor winding to keep the voltage difference measured below a predetermined value above said reference voltage difference. It is by this ensured that the rotor current may never be increased to such high degrees that components of the alternator, such as diodes of the rectifier, will be destroyed.

According to another embodiment of the invention the evaluation unit is configured to compare the development over time of the difference of the two phase voltages measured with a development over time of a voltage difference expected for the rotor current actually flowing through the rotor winding and determine that a degraded functionality of the alternator is detected upon a deviation of said measured voltage difference from said expected voltage difference by at least a predetermined amount. A degraded functionality of the alternator in the form of for example a broken cable connecting to the output of the alternator, such as to an electric battery, may be detected in this way enabling protection of components of the alternator which may otherwise be destroyed.

According to another embodiment of the invention the evaluation unit is configured to compare the appearance of the development over time of the difference of the two phase voltages measured with the appearance of a sine curve to detect possible defects of components of said rectifier. The need of replacing components of the rectifier may by this be reliably detected as soon as existing.

According to another embodiment of the invention the rotor is configured to be connected to a source of mechanic energy of a motor vehicle. The arrangement is particularly suitable for that application.

According to another embodiment of the invention the rotor is configured to be connected to a source of mechanic energy within an industrial application, which is another possible suitable application for an arrangement according to the invention.

The object of the present invention is with respect to the method obtained by providing a method with the features listed in the appended independent method claim. The advantages thereof appear from the above discussion of the arrangement of the invention and the embodiments thereof.

The invention also relates to a motor vehicle, a computer program, a computer program product, an electronic control unit and a use of an arrangement according to the invention according to the appended claims directed to a motor vehicle, a computer program, a computer program product, an electronic control unit and a use, respectively.

Further advantages as well as advantageous features of the invention will appear from the description following below.

BRIEF DESCRIPTION OF THE DRAWINGS

With reference to the appended drawings, below follows a specific description of an embodiment of the invention cited as an example.

In the drawings:

FIGS. 2 and 3 are graphs of the difference of two phase voltages of the alternator in the arrangement shown in FIG. 1 versus time for two different faults in connection with the arrangement.

DETAILED DESCRIPTION OF AN EMBODIMENT OF THE INVENTION

Figure 1:
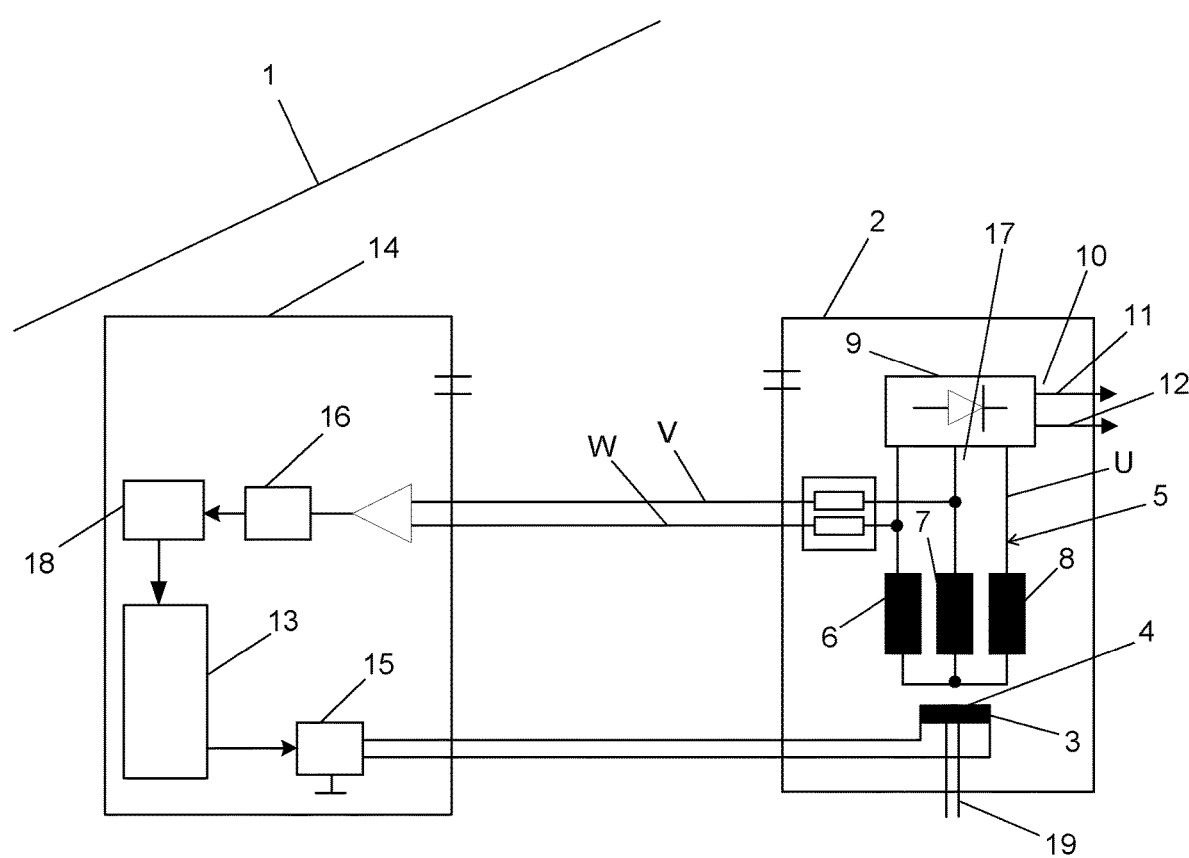
FIG. 1 is a schematic view illustrating an arrangement according to an embodiment of the invention.

FIG. 1 shows very schematically an arrangement according to an embodiment of the invention for generating electric energy arranged inside a motor vehicle 1 and comprising an alternator 2 having a rotor 3 which is configured to be connected to a source of mechanic energy, such as the shaft 19 of an engine of the vehicle, for being rotated and which is provided with a winding 4 for being magnetized by an electric current fed therethrough. The alternator has also a stator 5 surrounding the rotor 3, although not shown in that way in FIG. 1 for simplifying the illustration and explanation of the invention, and which has three stator windings 6-8 for generation of three phase voltages U, V, W in these windings upon rotation of the magnetized rotor therein. The alternator has also a rectifier 9 with an input 17 connected to the stator windings 6-8 and is configured to convert the phase voltages U, V, W into a direct voltage on an output 10 of the alternator, here symbolized by two cables 11, 12 to one or more electric batteries of the vehicle. The rectifier 9 may consist of only rectifying diodes with no need of control of the rectifier or be connected to a separate control unit for actively controlling the rectifying action.

The arrangement further comprises a control unit 13 configured to control the alternator 2 by controlling the rotor current flowing through the rotor windings. This control unit 13 is included in an electronic control unit 14 located remote to the alternator 2, so that the electronics of the control unit 13 has not to be considered when deciding the maximum allowable temperature within the alternator. The control unit 13 does here control the rotor current by sending PWM (Pulse Width Modulation) signals to a so-called driver 15 sending a current to the rotor winding 4 depending upon the appearance of said PWM signals.

The arrangement further comprises means 16 configured to measure the development over time of the difference of two of said phase voltages connected to the input 17 of the rectifier 9, here V and W by connection thereof to the measuring means 16. The measuring means sends the result of the measurement to an evaluation unit 18 configured to evaluate the result of this measurement to determine the functionality of the alternator 2. The evaluation unit 18 and the control unit 13 are included in the same electronic control unit 14 configured to control the alternator, and the evaluation unit is configured to send the result of said evaluation to the control unit 13 which is configured to make the control of the rotor current and by that of the alternator depending upon the result of this evaluation.

The evaluation unit is configured to compare the development over time of the difference of the two phase voltages V, W measured with a development over time of a reference value of this voltage difference. The evaluation unit is here configured to compare the development over time of the difference $U_{VW}$ of the two phase voltages measured with a development over time of a voltage difference $U_E$ expected for the rotor current actually flowing through the rotor winding and determine that a degraded functionality of the alternator is detected upon a deviation of the measured voltage difference $U_{VW}$ from said expected voltage difference $U_E$ by at least a predetermined amount.

FIG. 2 illustrates what happens with said voltage difference $U_{VW}$ when a cable 11, 12 on the output of the alternator 10, such as to an electric battery, is broken, which means that this voltage difference will be higher than expected. Such a breaking or rupture of a cable will result in a great increase of the resistance in the electric system to which the arrangement is connected and the control unit 13 will then increase the rotor current so as to handle the new "load". This would result in destroying of components in the alternator would the alternator be allowed to generate voltages being as high as requested. However, this will here be avoided by the fact that the evaluation unit will through said comparison detect such a degraded functionality of the alternator and the control unit 13 is configured to control the rotor current flowing through the rotor windings to keep the voltage difference $U_{VW}$ measured below a predetermined value above the reference voltage difference $U_E$.

The evaluation unit 16 is also configured to compare the appearance of the development over time of the difference of the two phase voltages V, W measured with the appearance of a sine curve to detect possible defects of components of the rectifier, since a diode fault will result in a voltage difference $U_{VW}$ versus time t deviating from a sine curve as shown in FIG. 3.

Figure 4:
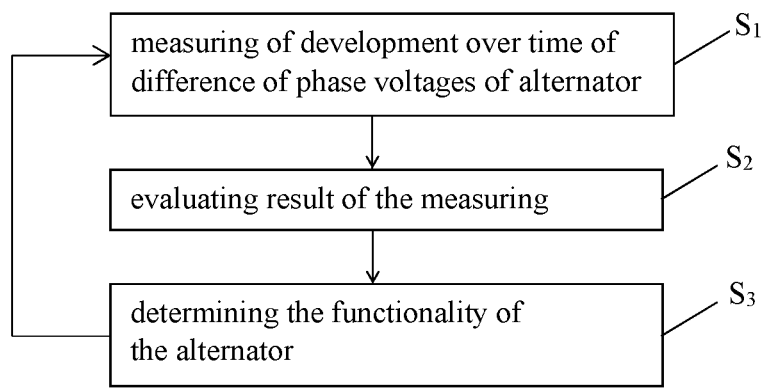
FIG. 4 is a flow chart illustrating the steps performed by a method according to an embodiment of the invention.

FIG. 4 illustrates a flow chart of the method according to the invention carried out for determining the functionality of an alternator in a vehicle. The method is started with the step $S_1$ of measuring development over time of a difference of phase voltages V, W of the alternator. The measuring result is then evaluated in the step $S_2$, whereupon the functionality of the alternator is determined in a step $S_3$. These steps are repeated, preferably continuously during operation of the alternator so as to detect occurrence of possible faults in the alternator or in connections therewith as soon as possible.

Figure 5:
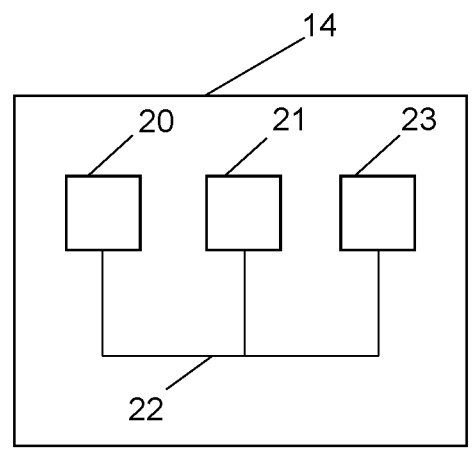
FIG. 5 is a schematic view illustrating an electronic control unit for implementing a method according to the invention.

Computer program code for implementing a method according to the invention is with advantage included in a computer program which can be read into an internal memory of a computer, e.g. an internal memory of an electronic control unit of a motor vehicle. Such a computer program is with advantage provided via a computer program product comprising a data storage medium which can be read by a computer and which has the computer program stored on it. Said data storage medium is for example an optical data storage medium in the form of a CD ROM disc, a DVD disc etc., a magnetic data storage medium in the form of a hard disc, a diskette, a cassette tape etc., or a flash memory or a memory of the ROM, PROM, EPROM or EEPROM type. FIG. 5 illustrates very schematically an electronic control unit 14 comprising an execution means 20, e.g. a central processor unit (CPU), for execution of computer software. The execution means 20 communicates with a memory 21, e.g. of the RAM type, via a data bus 22. The control unit 14 comprises also a non-transitory data storage medium 23, e.g. in the form of a flash memory or a memory of the ROM, PROM, EPROM or EEPROM type. The execution means 20 communicates with the data storage medium 23 via the data bus 22. A computer program comprising computer program code for implementing a method according to the invention, e.g. in accordance with the embodiment illustrated in FIG. 4 is stored on the data storage medium 23.

The invention is of course in no way restricted to the embodiments described above, since many possibilities for modifications thereof are likely to be obvious to one skilled in the art without having to deviate from the scope of invention defined in the appended claims.

The rotor may besides having a winding be provided with permanent magnets which would then have the function to improve the efficiency of the alternator, but a control thereof would still be electrical by controlling the electric current fed through the rotor winding.

The alternator may have more than three phases which would have the advantage of reducing the ripple of the DC voltage generated by the rectifier. However, the greater number of phases would result in an increased complexity of the alternator.

The invention claimed is:

1. An arrangement for generating electric energy comprising an alternator having
   a rotor which is configured to be connected to a source of mechanic energy for being rotated and which is provided with a winding for being magnetised by an electric current fed therethrough,
   a stator surrounding the rotor and having at least three stator windings for generation of at least three phase voltages (U, V, W) in these windings upon rotation of the magnetised rotor therein, and
   a rectifier with an input connected to the stator windings and configured to convert said phase voltages into a direct voltage on an output of the alternator,
   the arrangement further comprising a control unit located remote to the alternator and configured to control the alternator by controlling the rotor current flowing through the rotor winding,
   wherein the arrangement further comprises
      means configured to measure the development over time of the difference of two (V, W) of said phase voltages connected to the input of the rectifier, and
      an evaluation unit configured to evaluate the result of this measurement to determine the functionality of the alternator,
   wherein the evaluation unit is configured to send the result of said evaluation to said control unit which is configured to make the control of the rotor current and by that of the alternator depending upon the result of said evaluation, and
   wherein the evaluation unit is configured to compare the appearance of the development over time of the difference (UVW) of the two phase voltages measured with the appearance of a sine curve of a voltage difference (UE) expected for the rotor current actually flowing through the rotor winding to detect possible defects of components of said rectifier upon deviation of said measured voltage difference (UVW) from said expected voltage difference (UE) by at least a predetermined amount.

2. The arrangement according to claim 1, wherein the evaluation unit and the control unit are included in the same electronic control unit configured to control the alternator.

3. The arrangement according to claim 1, wherein the control unit is configured to control the rotor current flowing through the rotor winding to keep the voltage difference measured below a predetermined value above said expected voltage difference ($U_E$).

4. The arrangement according to claim 1, wherein the rotor is configured to be connected to a source of mechanic energy of a motor vehicle.

5. The motor vehicle, especially a wheeled heavy motor vehicle, such as a truck or a bus, wherein it is provided with an arrangement according to claim 1.

6. The arrangement according to claim 1, wherein the rotor is configured to be connected to a source of mechanic energy within an industrial application.

7. A use of an arrangement according to claim 1 to generate electric energy in a motor vehicle.

8. A method for determining the functionality of an alternator having
   a rotor which is configured to be connected to a source of mechanic energy for being rotated and which is provided with a winding for being magnetised by an electric current fed therethrough,
   a stator surrounding the rotor and having at least three stator windings for generation of at least three phase voltages (U, V, W) in these windings upon rotation of the magnetised rotor therein, and
   a rectifier with an input connected to the stator windings and configured to convert said phase voltages into a direct voltage on an output of the alternator,
   the alternator being included in an arrangement for generating electric energy and further comprising a control unit located remote to the alternator and configured to control the alternator by controlling the rotor current flowing through the rotor winding, wherein the method further includes:
      measuring the development over time of the difference of two (V, W) of said phase voltages connected to the input of the rectifier,
      determining the functionality of the alternator by evaluating the result of this measurement,
      sending the result of said evaluation to said control unit which is configured to make the control of the rotor current and by that of the alternator depending upon the result of said evaluation, and comparing the appearance of the development over time of the difference (UVW) of the two phase voltages measured with the appearance of a sine curve of a voltage difference (UE) expected for the rotor current actually flowing through the rotor winding to detect possible defects of components of said rectifier upon deviation of said measured voltage difference (UVW) from said expected voltage difference (UE) by at least a predetermined amount.

9. The computer program comprising computer program code for causing a computer to implement a method according to claim 8 when the computer program is executed in the computer.

10. The computer program product comprising a non-transitory data storage medium which can be read by a computer and on which the program code of a computer program according to claim 8 is stored.

11. The electronic control unit of a motor vehicle comprising an execution means, a memory connected to the execution means and a non-transitory data storage medium which is connected to the execution means and on which the computer program code of a computer program according to claim 9 is stored.

* * * * *